US011573338B1

(12) United States Patent
Nagarkar et al.

(10) Patent No.: US 11,573,338 B1
(45) Date of Patent: Feb. 7, 2023

(54) SCINTILLATOR WITH FAST DECAY TIME

(71) Applicant: Radiation Monitoring Devices, Inc., Watertown, MA (US)

(72) Inventors: Vivek V. Nagarkar, Weston, MA (US); Pijush Bhattacharaya, Watertown, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 1 day.

(21) Appl. No.: 17/394,056

(22) Filed: Aug. 4, 2021

Related U.S. Application Data

(60) Provisional application No. 63/061,986, filed on Aug. 6, 2020.

(51) Int. Cl.
*G01T 3/06* (2006.01)
*C30B 28/12* (2006.01)
*C30B 29/12* (2006.01)
*C09K 11/77* (2006.01)

(52) U.S. Cl.
CPC ............ *G01T 3/06* (2013.01); *C09K 11/772* (2013.01); *C30B 28/12* (2013.01); *C30B 29/12* (2013.01)

(58) Field of Classification Search
CPC ......... G01T 3/06; C09K 11/772; C30B 28/12; C30B 29/12
See application file for complete search history.

(56) References Cited

U.S. PATENT DOCUMENTS

| | | | |
|---|---|---|---|
| 7,696,482 B1 | 4/2010 | Nagarkar | |
| 7,723,687 B2 | 5/2010 | Nagarkar | |
| 9,417,343 B1 | 8/2016 | Bhandari | |
| 10,125,312 B2 | 11/2018 | Boatner | |
| 2007/0262260 A1* | 11/2007 | Shah | ...................... C30B 11/00 250/361 R |
| 2017/0355905 A1 | 12/2017 | Bourret-Courchesne | |

FOREIGN PATENT DOCUMENTS

CN   109143319 A  *  1/2019

OTHER PUBLICATIONS

M.Bliss et al., Real-Time Dosimetry for Boron Neutron-Capture Therapy, IEEE Transactions on Nuclear Science, vol. 42, No. 4, Aug. 1995, pp. 639-643. (Year: 1995).*

Xianfei Wen, Andreas Enqvist, Measuring the scintillation decay time for different energy deposited by γ-rays and neutrons in a Cs2LiYCl6:Ce3+ detector, Nuclear Instruments and Methods in Physics Research Section A: Accelerators, Spectrometers, Detectors and Associated Equipment, vol. 853, May 1, 2017, pp. 9-15.

Todd Petterson, Lars R Furenlid, SPECT detectors: the Anger Camera and beyond, Physics in Medicine and Biology 56(17):R145-82, Sep. 2011.

(Continued)

*Primary Examiner* — Hugh Maupin
(74) *Attorney, Agent, or Firm* — Orlando Lopez; Culhane Meadows PLLC

(57) ABSTRACT

Scintillators that can support up to 20 MHz count rates, which is significantly faster than the required 100K counts/second needed for single crystal diffractometers and methods for fabricating them.

21 Claims, 9 Drawing Sheets

(56) References Cited

OTHER PUBLICATIONS

L. A. Boatner et al., Improved lithium iodide neutron scintillator with Eu2+ activation II: Activator zoning and concentration effects in Bridgman-grown crystals, Nuclear Instruments and Methods in Physics Research Section A Accelerators, Spectrometers, Detectors and Associated Equipment,vol. 903, Sep. 21, 2018, pp. 8-17.
V. V. Nagarkar et al. "Structured LiI Scintillator for Thermal Neutron Imaging," IEEE Transactions on Nuclear Science, 48, 6, 2330. (2001).
S. Khan, H. J. Kim, and Y. D Kim, "Scintillation characterization of thallium-doped lithium iodide crystals." Nuclear Instruments and Methods in Physics Research Section A: Accelerators, Spectrometers, Detectors and Associated Equipment. 793, 31-34 (2015).

* cited by examiner

SCINTILLATOR WITH FAST DECAY TIME

CROSS-REFERENCE TO RELATED APPLICATIONS

This application claims priority to U.S. Provisional Patent Application No. 63/061,986, entitled SCINTILLATOR WITH FAST DECAY TIME, filed Aug. 6, 2020, which is incorporated herein by reference in its entirety and for all purposes.

BACKGROUND

These teachings relate generally to scintillator materials with fast decay time. Novel detector technologies that can provide ~300 μm or better spatial resolution with gamma rejection better than $10^{-6}$ are needed to enable efficient measurement of small single crystals for diffraction and diffuse scattering measurements. Due to recent advances, large area neutron sensitive Anger cameras at ORNL based on silicon photomultiplier (SiPM) arrays have reached intrinsic resolutions that can fulfill the diffractometer requirements. However, currently used GS20 neutron scintillator limits the performance, with a maximum resolution of 0.6 mm to 0.7 mm FWHM. These performance limitations arise from the low brightness of GS20 glass, measuring only ~6,000 optical photons/thermal neutron interaction. In low light yield scintillators, the statistical variation in the number of optical photons, or quantum noise, for a given energy deposition sets the limits on energy and position resolution in scintillator-based Anger cameras. Because the resolution limit is due to the quantum noise from the scintillation process, increasing the pixelization will not improve the resolution of an Anger Camera detector. GS20 based Anger Cameras therefore cannot take advantage of newer sensors that are now available in 1-3 mm pixelization. As was shown recently with a 3 mm sensor, resolutions near 350 μm could be obtained by using a brighter scintillator. Further increases in brightness could allow detectors to achieve resolutions near 100 μm when coupled to 1 mm thick sensors. These higher resolutions are critical for new instruments proposed for the second target station at SNS such as EWALD, where detectors requiring resolutions near 300 μm have been proposed. Such resolutions, it should be repeated, are unobtainable with available lithium glass scintillators, such as GS20.

Some scintillators with high resolution suffer from other difficulties. While the desirable scintillator properties of $^6$LiI:Eu have been known for some time, the extreme hygroscopic nature of the material has prevented the realization of thin films of this exciting material. While even a single crystal of $^6$LiI:Eu is vulnerable to attack from moisture, a thin film has a surface area that is many times greater than that of a single crystal. This means that the hygroscopic nature of $^6$LiI:Eu has historically prevented growing $^6$LiI films with the anticipated properties.

Neutron scattering is a powerful technique used to study the atomic and magnetic structure of novel materials. For such experiments, neutrons are typically produced at a spallation source, such as the Spallation Neutron Source (SNS) at Oak Ridge National Laboratory. The single crystal diffractometers at SNS along with those proposed for the second target station seek better spatial resolutions with a goal of allowing the routine measurement of samples of the order of 0.1 mm on a side. Samples of these dimensions are routinely grown for experiments with x-rays, but their small size makes it impossible or problematic to measure them with scattering instruments that have detector resolutions that exceed the dimensions of the sample. To enable the instruments to investigate new areas of science such as diffuse scattering, they seek to dramatically lower backgrounds. Diffuse scattering which examines defects in lattice structures through measurements of weak background structures requires low background sensitivity. Reducing the gamma sensitivity in Anger Camera detectors would greatly expand the science capabilities in this important field of neutron scattering.

The scintillator component of the detector converts neutrons into visible light that can be readout using a SiPM. The challenge is to develop an efficient neutron sensitive scintillator that can effectively reject gammas. However, because most scintillators exhibit small neutron cross sections, the scintillator should also be thick enough to capture the neutrons, but not so thick as to absorb gammas. A scintillator with a high neutron cross section that does not generate or detect gammas is, therefore, essential.

The two reflectometers at SNS serve rapidly growing communities in the fields of nanoscience, membrane bioscience, surfactant chemistry, and related areas. The instruments are optimized to investigate magnetic and chemical density profiles in surfaces, thin films, interfaces, and multilayer systems, including free-standing liquid surfaces and interfaces. Most importantly, they are capable of routinely detecting weak off-specular scattering signals from chemical/magnetic structures within the layer plane. Primarily due to rate limitations of the detectors, such experiments are unreasonably slow on many extant instruments. Scintillators that can support up to 20 MHz count rates, which is significantly faster than the required 100K counts/second needed for single crystal diffractometers, and address one of the important limitations of the detectors for high data rate neutron reflectometers are needed.

BRIEF SUMMARY

The present teachings disclose scintillators that can support up to 20 MHz count rates, which is significantly faster than the required 100K counts/second needed for single crystal diffractometers, and address one of the important limitations of the detectors for high data rate neutron reflectometers and can achieve resolutions near 100 μm.

For a better understanding of the present teachings, together with other and further needs thereof, reference is made to the accompanying drawings and detailed description.

DETAILED DESCRIPTION

Figure 1:
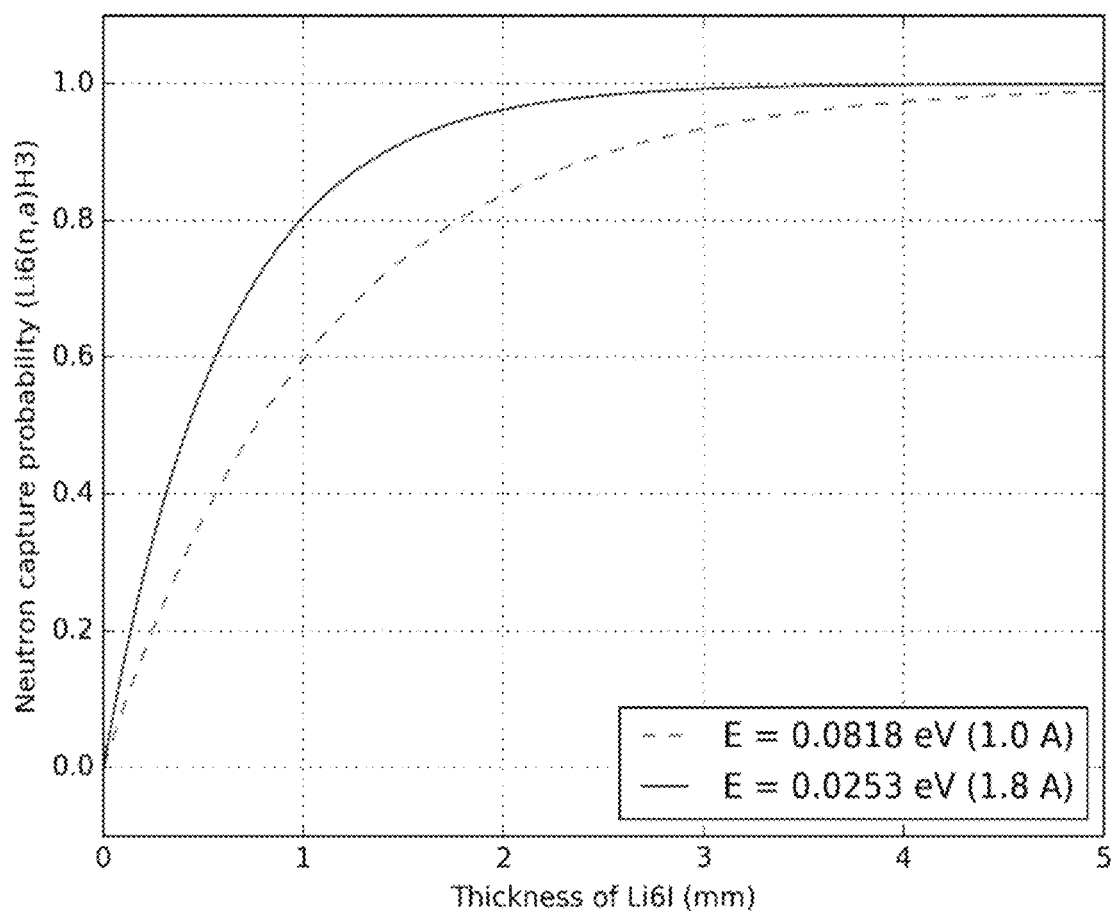
FIG. 1 shows predicted Neutron capture probability for $^6$LiI:Eu scintillator screens for 1.0 Å and 1.8 Å wavelength neutrons.

The following detailed description presents the currently contemplated modes of carrying out the present teachings. The description is not to be taken in a limiting sense but is made merely for the purpose of illustrating the general principles of the teachings, since the scope of the teachings is best defined by the appended claims.

"Decay time," as used herein, refers to a fast primary decay component (see, for example, Xianfei Wen, Andreas Enqvist, Measuring the scintillation decay time for different energy deposited by γ-rays and neutrons in a $Cs_2LiYCl_6$:$Ce^{3+}$ detector, Nuclear Instruments and Methods in Physics Research Section A: Accelerators, Spectrometers, Detectors and Associated Equipment, Volume 853, 1 May 2017, Pages 9-15, which is incorporated herein by reference in its entirety and for all purposes, see Equation 1).

Scintillators are the predominant material for the neutron converter in single crystal diffractometer detector systems, with GS20 long having been the most common choice. Although a full description of scintillation involves several processes, a simple model is that electron-hole pairs created in scintillators stay bound to each other as mobile pseudoparticles known as excitons. Excitons eventually find their way to luminescent (dopant) centers where they can recombine via radiative transitions with energies lower than the bandgap, emitting light in the process that, importantly, is at a wavelength that is not reabsorbed by the crystal. In many scintillators this recombination can proceed through different intermediate excited states, leading these scintillators to exhibit 'fast' and 'slow' components in their light emissions (see Todd Peterson, Lars R Furenlid, SPECT detectors: the Anger Camera and beyond, Physics in Medicine and Biology 56(17); R145-82, September 2011, which is incorporated herein by reference in its entirety and for all purposes, and which cites Belyayskii Y D, Gulakov I R, Pertsev A N. Scintillation (deexcitation) time of CsI(Tl) after gamma. excitation. Journal of Applied Spectroscopy. 1971; 15:1331-4).

At the heart of an ideal neutron detector is a scintillator that exhibits high light yield, high neutron absorption efficiency, and has excellent capability in discriminating between neutron and gamma interactions based on the scintillation pulse height and shape. (See, for example, H. B. Bhandari, V. V. Nagarkar, O. E. Ovechkina, "Neutron detector and fabrication method thereof" U.S. Pat. No. 9,417,343B, which is incorporated herein by reference in its entirety and for all purposes.) Moreover, such a detector should be made into a large and usable format in a cost-effective manner. In one instance of these teachings, these challenges are addressed through the development of microcolumnar $^6$LiI:X (where X is dopant such as Eu, Ce, Tl) for neutron detection. The purity of the lithium used is 95% $^6$Li in order to increase the neutron scattering cross section. (In another instance, a crystal of $^6$LiI:X is grown.) In one instance of these teachings, these challenges are addressed through the development of microcolumnar $^6$LiI:X (where X is dopant such as Eu, Ce, Tl) for neutron detection. In these teachings, an interesting problem is addressed: a neutron detector for a high flux neutron source where neutron conversion efficiency and gamma rejection are the parameters for optimization.

The microcolumnar scintillator includes of an array of about 10 to about 50 μm diameter crystalline columns of $^6$LiI:X (where X is dopant such as Eu, Ce, Tl). $^6$LiI:X converts the thermal neutron signal into visible light through the $^6$Li(n,α) reaction.

To reject gammas, thinning the scintillator as much as possible is an easy and effective way to accomplish that goal. However, if the scintillator is thin, the neutron capture efficiency goes down. As such, one instance of these teachings is a thin scintillator screen containing the highest possible amount of $^6$Li to minimize film thickness but maximize gamma rejection and neutron capture at the same time. The challenge inherent in working with $^6$LiI is that the material is extremely hygroscopic and will be irrevocably damaged even after the minutest exposures to atmosphere.

In one instance, these teachings disclose $^6$LiI scintillators, but in a large area, microcolumnar film format that heretofore was not possible to grow because of the extreme hygroscopic nature of the material. The brightness of the $^6$LiI:X scintillators of these teachings is comparable to the brightness of $^6$LiI:Eu, which emits ~11,000 to 14,000 photons/MeV and is expected to yield as many as 40,000 to 50,000 photons for the $^6$Li(n,α) reaction, a factor ~8 higher yield than current GS20 glass, and with optimization of the Eu concentration, as many as 100,000 photons per neutron capture appears possible (L. Boatner et. al. Improved Lithium Iodide neutron scintillator with Eu2+ activation II: Activator zoning and concentration effects in Bridgman-grown crystals, NIMA 903 pp8-17 (2018) or U.S. patent application Ser. No. 10/125,312, which are incorporated herein by reference in their entirety and for all purposes). The high thermal neutron efficiency of $^6$LiI:Eu implies that only ~1.0 mm of $^6$LiI:Eu is needed to absorb about 60% of 1 Å neutrons (FIG. 1). FIG. 1 shows predicted Neutron capture probability for $^6$LiI:Eu scintillator screens for 1.0 Å and 1.8 Å wavelength neutrons.

Figure 2A:
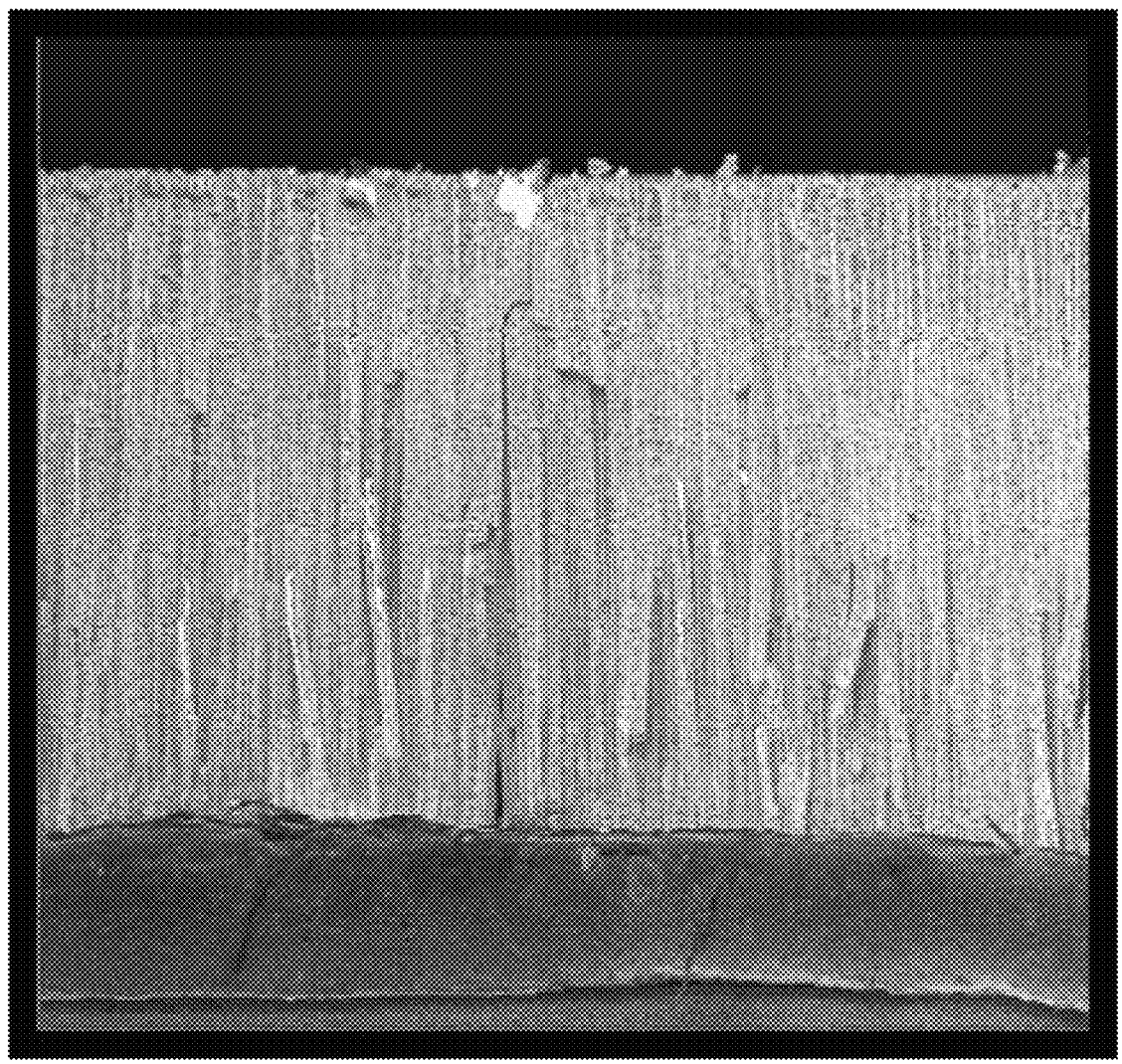
FIGS. 2A, 2B show: SEM micrographs of the LiI:Eu film.
Figure 2B:
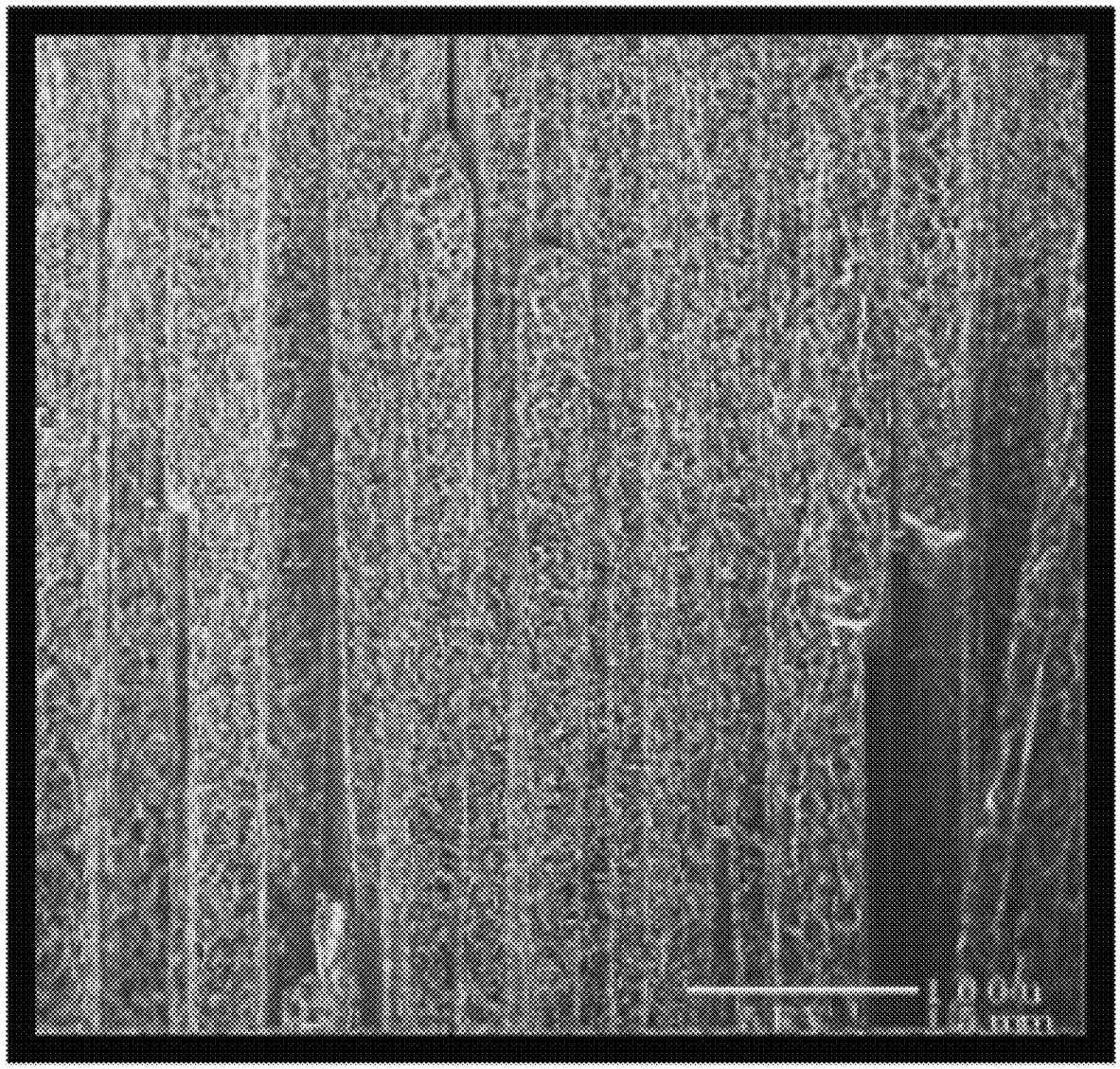

Earlier work has shown that $^6$LiI:Eu fabricated using physical vapor deposition grows in a microcolumnar form (Figures A, 2B) (see V. V. Nagarkar et al. "Structured LiI Scintillator for Thermal Neutron Imaging," IEEE Transactions on Nuclear Science, 48, 6, 2330. (2001), U.S. Pat. Nos. 7,696,482 and 7,723,687, which are incorporated herein by reference in their entirety and for all purposes). FIGS. 2A, 2B show: SEM micrograph of the LiI:Eu film showing micro-columnar structure. (FIG. 2A) cross-sectional view of a 1.2 mm thick film (FIG. 2B) close-up view, showing 30 μm micro-columns. The microcolumnar nature channels the scintillation light within the 20-30 μm wide columns, thereby preserving the spatial resolution for thick scintillators, where the thickness of the scintillator would aid in increasing the neutron absorption (FIG. 1). Also, the use of physical vapor deposition means that large area scintillators (50×50 cm$^2$ or larger) can be deposited, which are well in excess of the typical crystal growth.

Efforts reported in these teachings have resulted in the Bridgman growth of LiI crystals doped with cerium which has demonstrated a fast decay component of 45 ns that is commensurate with the Ce$^{3+}$ fast transition. (For the Bridgman technique, see, for example, Stockbarger, C Donald, Review of Scientific Instruments 7 (1936) 133, which is incorporated by reference here in and for all purposes.) At the same time, the $^6$LiI:Ce crystal demonstrates the light yield of 15,400 photons/MeV for gamma rays and excellent neutron-gamma discrimination based on pulse height (PHD) and pulse shape discrimination (PSD). Similarly, Sajid Khan et al. have recently demonstrated excellent scintillation and luminescence properties of thallium-doped LiI crystals grown by Bridgman technique which demonstrates light yield of 14,000±1,400 photons/MeV for gamma rays and a double exponential decay with a 185 ns fast component (see S. Khan, H. J. Kim, and Y. D Kim, "Scintillation characterization of thallium-doped lithium iodide crystals." Nuclear Instruments and Methods in Physics Research Section A: Accelerators, Spectrometers, Detectors and Associated Equipment. 793, 31-34 (2015), which is incorporated herein by reference in its entirety and for all purposes). ($^6$LiI doped with Tl$^{1+}$ in a crystal form has demonstrated 185 ns decay, which is about 7 times faster than the $^6$LiI:Eu decay, without any penalty in light yield.)

Figure 3A:
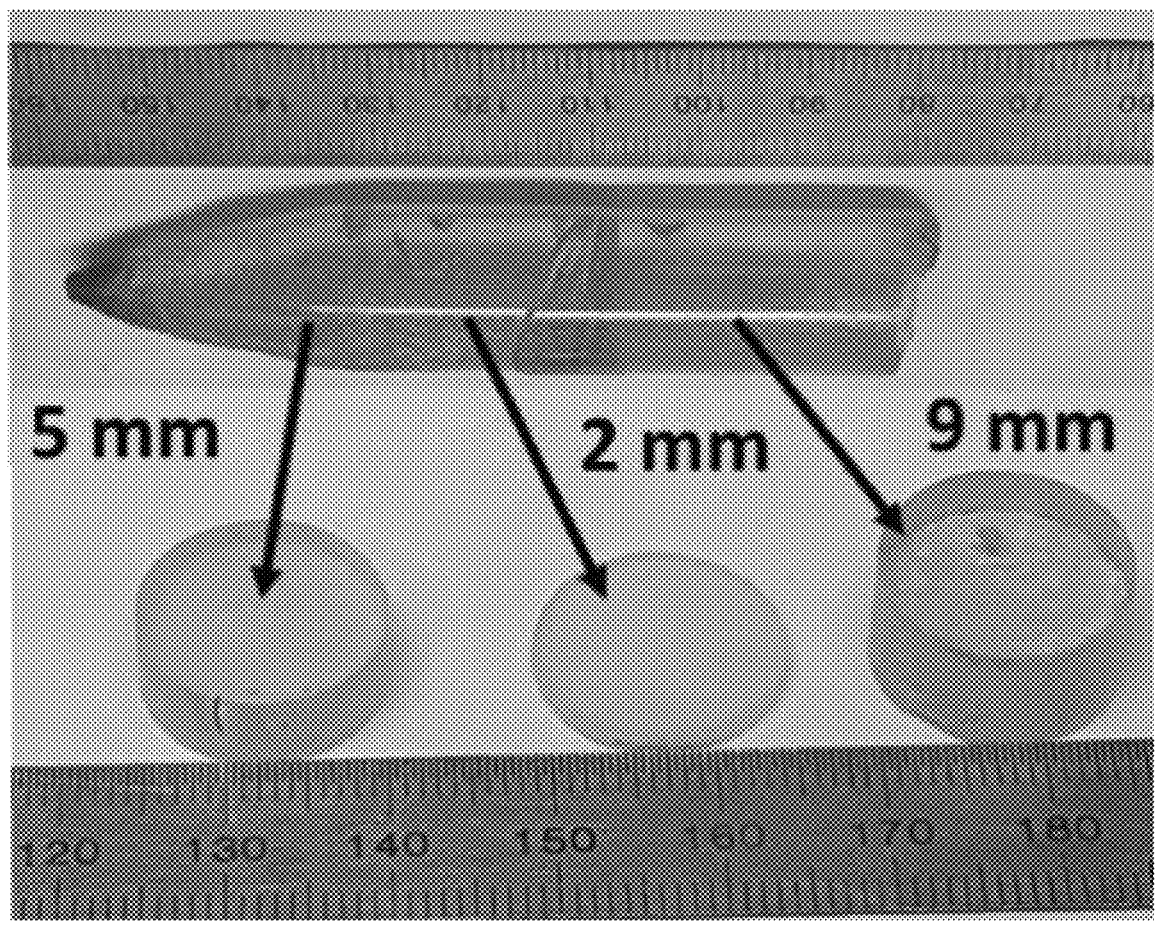
FIGS. 3A-3C show results for a $^6$LiI:Ce scintillator material of these teachings.
Figure 3B:
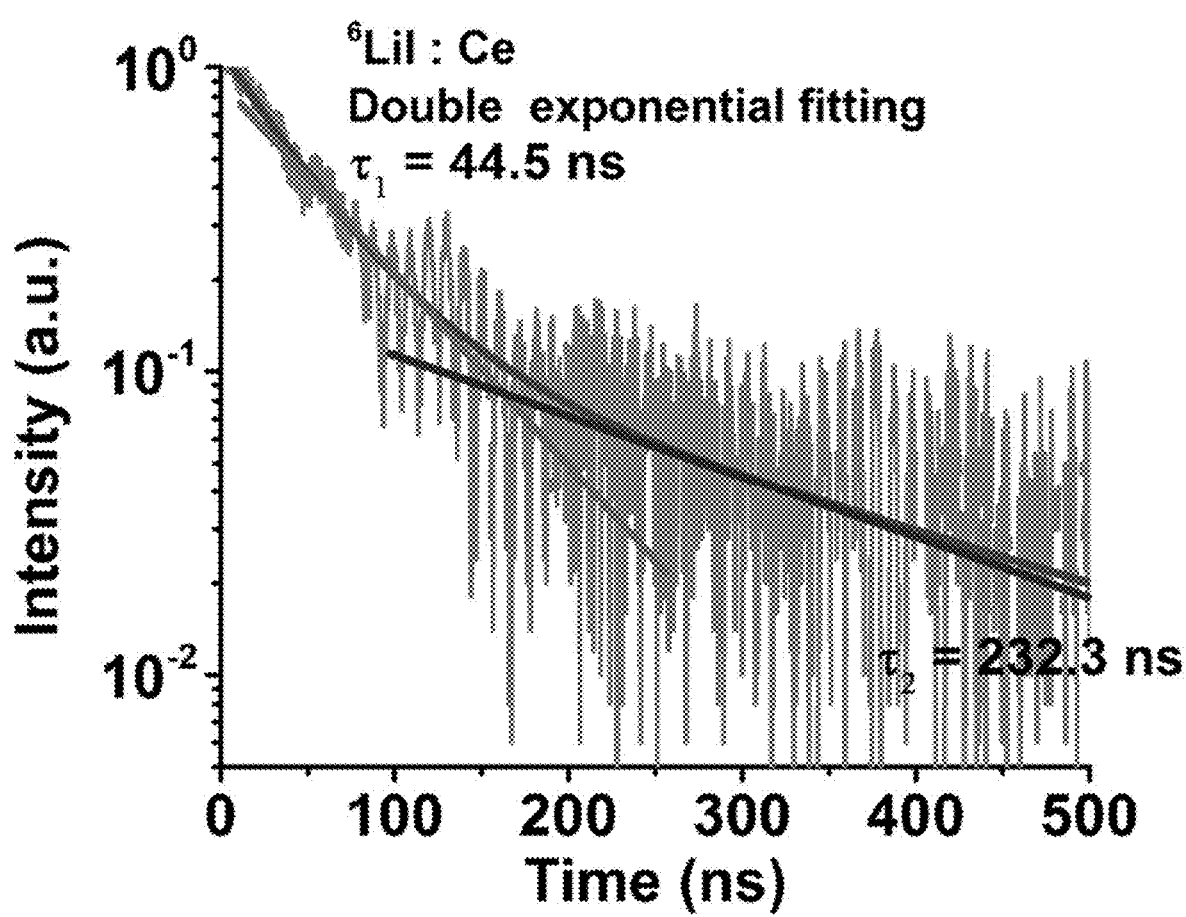
Figure 3C:
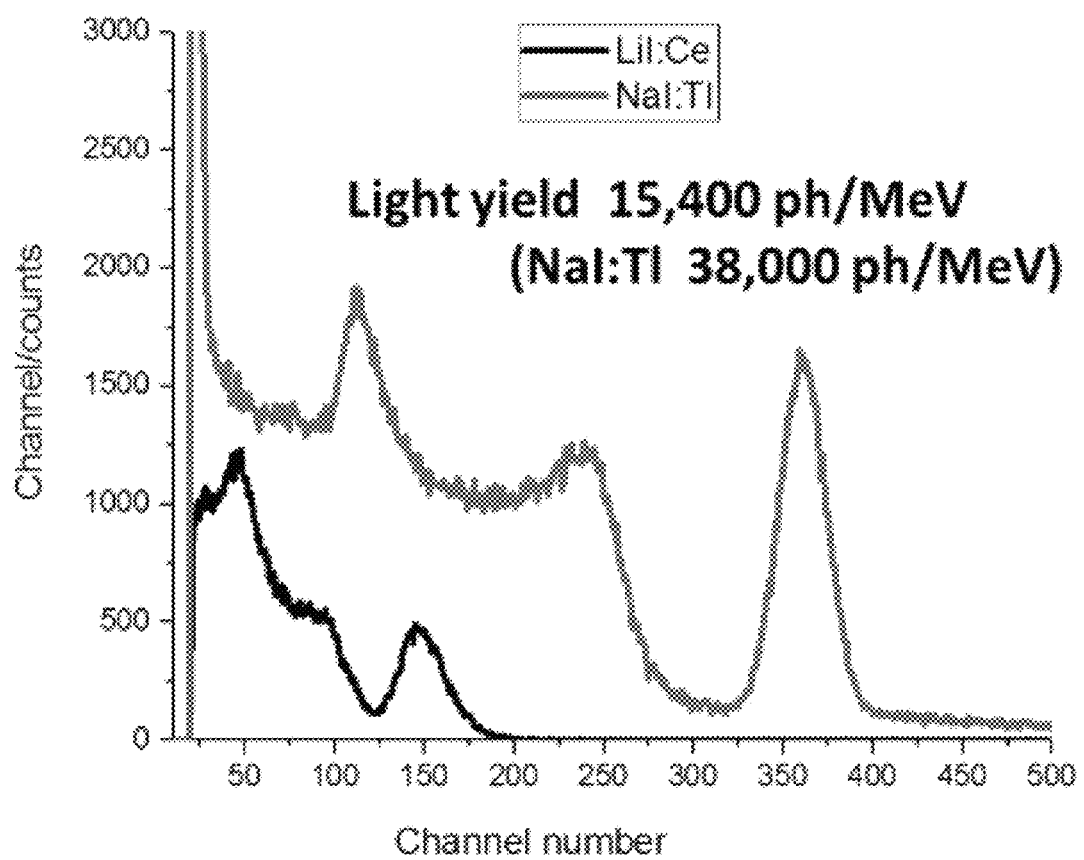

Efforts reported in these teachings directed at $^6$LiI:Ce have demonstrated transformational improvement in $^6$LiI speed without sacrificing the light yield. FIGS. 3A-3C show results for a $^6$LiI:Ce scintillator material. FIG. 3A shows a photograph showing $^6$LiI:Ce crystal grown at RMD. The crystal was sliced and polished. The data shown is for the 9 mm thick piece. FIG. 3B shows the thermal neutron response of the $^6$LiI:Ce slice showing 45 ns decay. FIG. 3C shows the light yield of the $^6$LiI:Ce compared to the standard NaI:Tl crystal measured using 662 keV $^{137}$Cs source, demonstrating light yield of 15,600 photons/MeV (for gammas). The gamma-equivalent energy (GEE) for the centroid of the neutron distribution was measured to be 2569 keV (not shown here), implying the light yield for thermal neutron interaction of over 40,000 photons/neutron. This is already a factor of 6.7 higher compared to the current GS20 glass scintillator, without any optimization.

As can be seen from FIGS. 3A-3C, the $^6$LiI:Ce single crystal shows the fast primary decay component of 45 ns and a light yield of 15,400 photons/MeV (for gammas). To our knowledge this is the fastest known decay for an inorganic thermal neutron scintillator. With such a fast speed the scintillator can support up to 20 MHz count rates, which is significantly faster than the required 100K counts/second needed for single crystal diffractometers and addresses one of the important limitations of the detectors for high data rate neutron reflectometers. It is also worth noting that the $^6$LiI:Ce scintillator also demonstrates excellent neutron-gamma discrimination based on PHD (with GEE=2.5 or higher). With this excellent discrimination ability and the fact that a thin film of $^6$LiI:Ce is needed to realize high absorption efficiency for thermal neutrons, which is practically 'transparent' to high energy gammas, it is anticipated that n-γ discrimination on the order of 10$^{-6}$ is achievable. These excellent scintillation properties are obtained in a large area (15×15 cm$^2$)$^6$LiI:Ce thin film formed by thermal vapor deposition that can simultaneously demonstrate over 60% efficiency for 1 Å neutrons, spatial resolution of ~300 μm, and n-γ discrimination on the order of 10$^{-6}$ with a <5% dead time at 100K counts/second. Other co-dopants can also be added, and scintillators doped with Ce and other co-dopants are within the scope of these teachings. (The above shows that lithium-6 iodide doped with Cerium, at a preselected Cerium amount, achieves a decay time of less than 46 ns and is configured to support up to 20 MHz count rates.)

In one instance, the scintillator of these teachings includes a deposited film of lithium-6 iodide ($^6$Li I) doped with Cerium (Ce); the scintillator having a decay time of less than 46 ns and an area between 25 c. The deposited film can have a thickness from a number of desired ranges of thicknesses; thicknesses from 10 μm to 1200 μm are easily achievable. The deposited film can have an area between 25 cm$^2$ and 2500 cm$^2$, or, preferably, between 100 cm$^2$ and 2500 cm$^2$. The lithium-6 iodide is doped with Cerium in an amount in the range of 0.3 to 5 weight percent (Ce concentration).

The film of lithium-6 iodide is made by, first, placing the material to be deposited to form the film of lithium-6 iodide, doped with a predetermined doping material, in evaporation containers in an evaporation chamber, the placing occurring in an inert dry atmosphere. For lithium-6 iodide doped with Cerium, one container with the lithium-6 iodide and another container with Cerium iodide are placed in the evaporation chamber. For multiple dopants, a container of the compound for each dopant is placed in the evaporation chamber. The evaporation chamber is then evacuated (for example, to a base pressure of 10$^{-6}$ Torr) and the film of lithium-6 iodide, doped with the predetermined doping material, deposited. After deposition, the film of lithium-6 iodide, doped with the predetermined doping material is placed in a hermetically seal container, the placing occurring in an inert dry atmosphere. Using that procedure, the film of lithium-6 iodide is not exposed to an atmosphere with moisture. The $^6$LiI is cubic and is well suited for microcolumnar growth using vapor deposition techniques.

Unlike in standard crystal growth, physical deposition from the vapor phase is largely a function of the partial pressures of the constituent materials, opening up the possibility of synthesizing chemical compositions that are not achievable directly from a melt. One advantage is to dope or co-dope atoms into the film in a precisely controlled way. In order to use physical vapor deposition via the co-evaporation process to make thin films of $^6$LiI:X (where X is dopant such as Eu, Ce, Tl), ultrapure source material is purchased from a commercial vendor, and the material is received in a sealed glass ampoule under argon. The material is removed from the ampoule inside the confines of a nitrogen glovebox (for example, <0.1 ppm O$_2$, <0.1 ppm H$_2$O). The material is then loaded into resistively heated evaporation containers (for example, tantalum boats) inside the vacuum chamber. After the chamber has a base pressure of 10$^{-6}$ Torr, the evaporation containers are heated to evaporate the constituent materials. The low pressure increases the mean free path of the evaporated atoms, which travel in a straight line from the opening of the evaporation container to the substrate. Careful control of the geometry of the system and control of deposition permits microcolumnar growth.

The glove box setup can also be used for crystal growth. A single crystal of lithium-6 iodide, doped with a predetermined doping material, is grown in the glove box setup, the growing occurring in an inert dry atmosphere. The single crystal is then sliced and polished, the slicing and polishing occurring in the inert dry atmosphere. At least one piece of sliced and polished single crystal is placed in a hermetically sealed container, the placing occurring in the inert dry atmosphere. The at least one piece of sliced and polished single crystal of lithium-6 iodide, doped with a predetermined doping material, is not exposed to an atmosphere with moisture.

Figure 4:
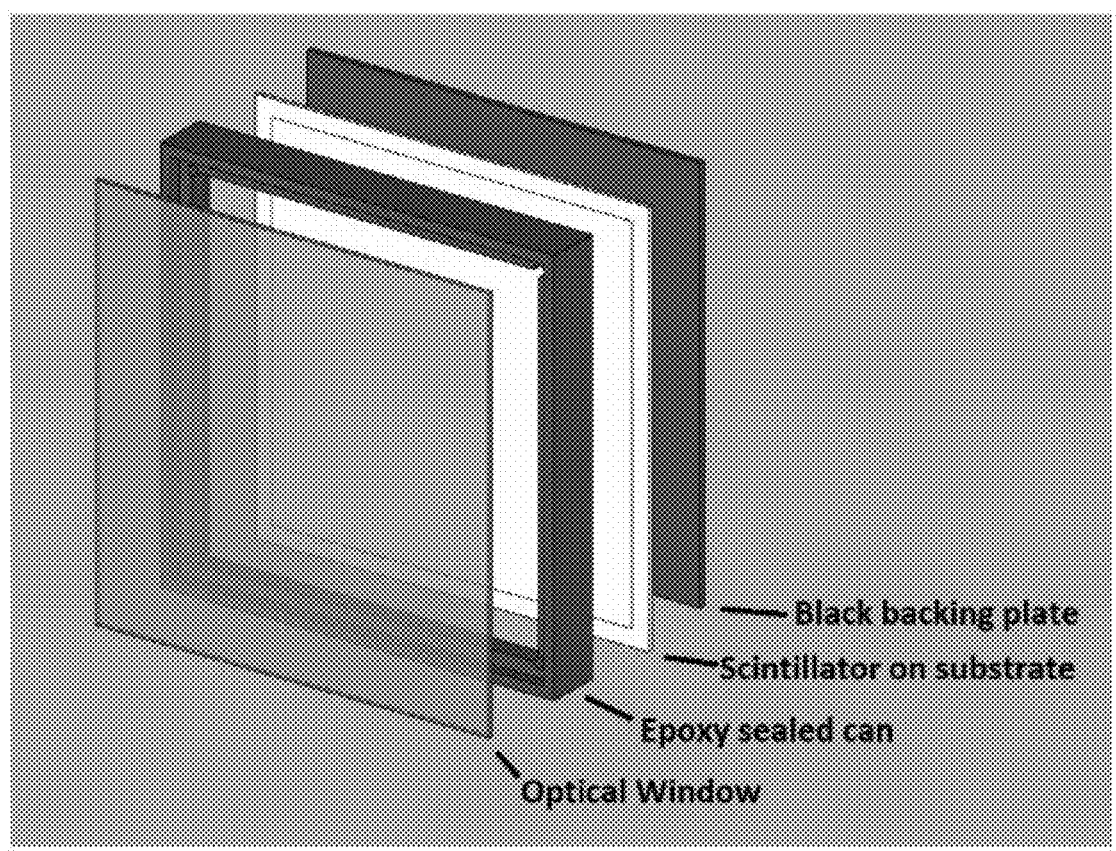
FIG. 4 shows a schematic of hermetic sealing of a hygroscopic scintillator in an aluminum can.
Figure 5:
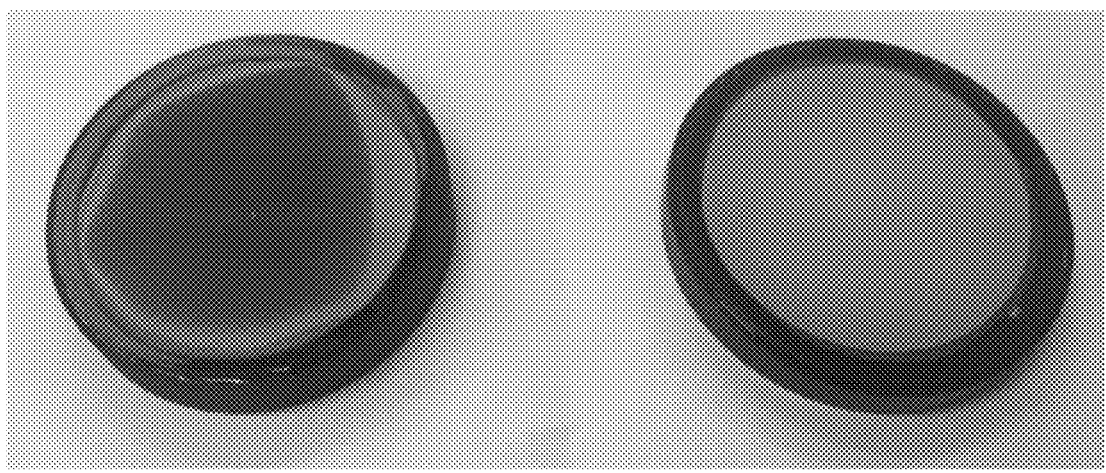
FIG. 5 represents a hygroscopic $LuI_3$:Ce scintillator screen produced in traditional evaporator set-up, showing significant browning after use, on the left, and a $LuI_3$:Ce scintillator screen grown and packaged in the GBE set-up of these teachings, showing no browning; and, FIG. 6 shows a block diagram representation of one embodiment of the system of these teachings.

Due to the hygroscopic nature of the $^6$LiI:X, the $^6$LiI:X should be packaged within the dry environment of the glovebox to ensure that the material is never exposed to moisture. RMD Inc. has designed an epoxy sealed can, as shown in FIG. 4, that hermetically seals the scintillator and protects it from moisture. FIG. 4 shows a Schematic of hermetic sealing of a hygroscopic scintillator in an aluminum can. The $^6$LiI:X scintillator is deposited onto an appropriate substrate, such as alumina. and is pressure coupled to an optical window that is epoxied into the can. An opaque backing plate is then similarly epoxied onto the back of the can. The epoxy should be resistant to moisture and bond well to a variety of substrates. Traditionally, the samples were rapidly removed from the evaporator and placed into the glovebox for packaging. The impact of hermetic sealing carried on a glove box equipped evaporator (GBE) grown samples is clearly evident in FIG. 5, in which a traditionally grown sample of a hygroscopic material (LuI$_3$:Ce) is shown on the left, and a GBE-grown sample is shown on the right.

The GBE-grown sample has no browning over a period of several months, and generally improved durability and brightness.

Other embodiments of packaging within the dry environment of the glovebox to ensure that the material is not exposed to moisture include coating with a protective epoxy or using atomic layer deposition (ALD) to deposit a conformal multilayer coating that confers protective properties on the scintillator.

Figure 6:
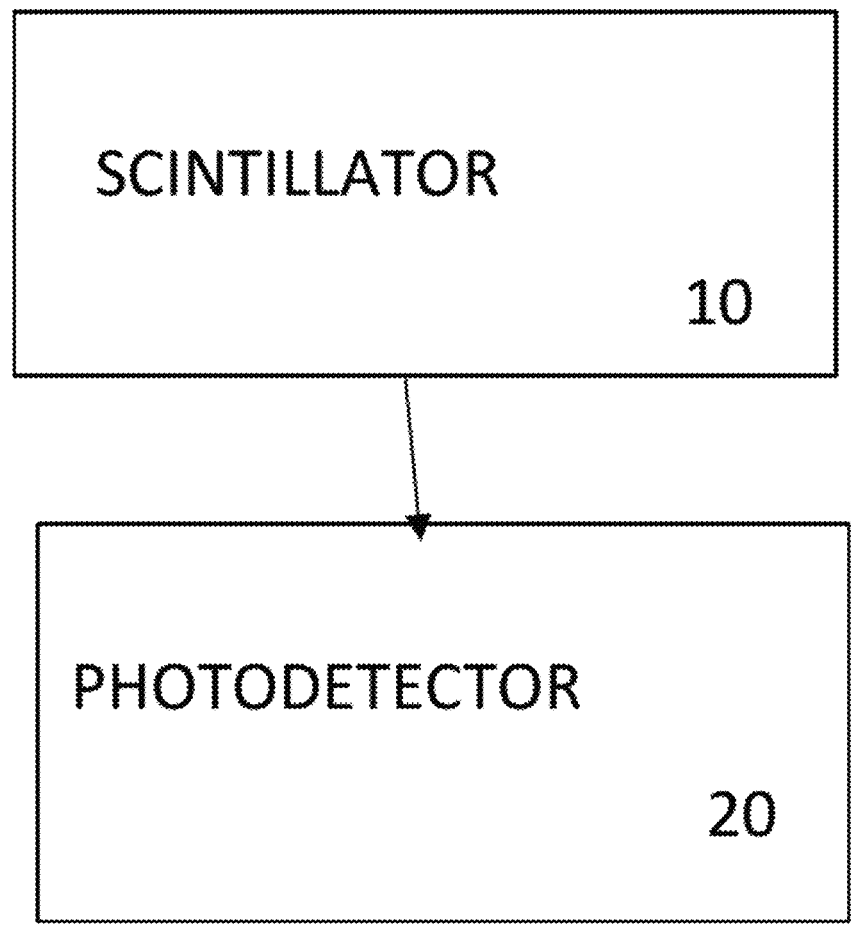

A neutron detector can include a scintillator as described hereinabove. Referring to FIG. 6, in one embodiment of a neutron detector, a scintillator 10 of these teachings is disposed in optical communication with a photodetector 20. Referring again to FIG. 6, incident neutrons strike the scintillator 10, causing the scintillator 10 to scintillate, producing a flash of light which is detected by the photodetector 20, which produce a signal.

A bright, fast neutron scintillator will increase the throughput on a valuable user resource—the single crystal diffractometer at the SNS. Examples of materials that would benefit are:
- Structures of large protein molecules, an important problem in biomedical research;
- Functional inorganic materials for studying the interplay of nuclear and magnetic structures such as doping-driven structural distortion in iridates, Fe and Co site occupancies in a molecular precursor,
- Hydrogen bonding, guest-host interaction, and guest mobility in hydride perovskites; uranyl nanoclusters; high-pressure synthesized mantle mineral and self-assembling tertiary amines,
- Catalytic and dihydrogen activation or exchange materials for the study of metal-hydrogen bonding in electrocatalyst and nanosized copper clusters, and
- Accurate atomic position and displacement parameters for charge density study of organic crystals containing a high percentage of hydrogen atoms.

These avenues of research benefit the public.

For the purpose of better describing and defining the present teachings, it is noted that terms of degree (e.g., "substantially," "about," and the like) may be used in the specification and/or in the claims. Such terms of degree are utilized herein to represent the inherent degree of uncertainty that may be attributed to any quantitative comparison, value, measurement, and/or other representation. The terms of degree may also be utilized herein to represent the degree by which a quantitative representation may vary (e.g., ±10%) from a stated reference without resulting in a change in the basic function of the subject matter at issue.

Although the teachings have been described with respect to various embodiments, it should be realized these teachings are also capable of a wide variety of further and other embodiments within the spirit and scope of the appended claims.

The invention claimed is:

1. A scintillator comprising:
a layer of lithium-6 iodide doped with Cerium; the scintillator configured to support up to 20 MHz count rates.

2. The scintillator of claim 1 wherein the lithium-6 iodide doped with Cerium has a decay time of less than 46 ns.

3. The scintillator of claim 2 wherein the layer of lithium-6 iodide doped with Cerium is obtained from a crystal.

4. The scintillator of claim 2 wherein the layer of lithium-6 iodide doped with Cerium is a deposited film.

5. The scintillator of claim 4 wherein the deposited film comprises a microcolumnar film.

6. The scintillator of claim 4 wherein the deposited film has an area between 25 $cm^2$ and 2500 $cm^2$.

7. The scintillator of claim 6 wherein the deposited film has an area between 100 $cm^2$ and 2500 $cm^2$.

8. A neutron detector comprising the scintillator of claim 1.

9. The neutron detector of claim 8 wherein the lithium-6 iodide doped with Cerium has a decay time of less than 46 ns.

10. The neutron detector of claim 9 wherein the layer of lithium-6 iodide doped with Cerium is obtained from a crystal.

11. The neutron detector of claim 9 wherein the layer of lithium-6 iodide doped with Cerium is a deposited film.

12. The neutron detector of claim 11 wherein the deposited film has an area between 25 $cm^2$ and 2500 $cm^2$.

13. The neutron detector of claim 12 wherein the deposited film has an area between 100 $cm^2$ and 2500 $cm^2$.

14. The neutron detector of claim 11 wherein the deposited film comprises a microcolumnar film.

15. A method for making a film of lithium-6 iodide, the method comprising:
placing material to be deposited to form the film of lithium-6 iodide, doped with a predetermined doping material, in evaporation containers in an evaporation chamber, the placing occurring in an inert dry atmosphere;
evacuating the evaporation chamber;
depositing the film of lithium-6 iodide, doped with the predetermined doping material; and,
placing the film of lithium-6 iodide, doped with the predetermined doping material in a hermetically sealed container, the placing occurring in the inert dry atmosphere;
wherein the film of lithium-6 iodide is not exposed to an atmosphere with moisture.

16. The method of claim 15 wherein the lithium-6 iodide is doped with Cerium.

17. The method of claim 15 wherein depositing the film comprises depositing a microcolumnar film.

18. The method of claim 15 wherein predetermined doping material comprises one or more dopants; and wherein the placing material to be deposited comprises placing one container with the lithium-6 iodide and placing one or more other containers, each one of the one or more other containers having the compound for each one of the one or more dopants.

19. The method of claim 15 wherein one dopant is used; wherein the one dopant is Cerium and the compound is Cerium iodide.

20. A method for making lithium-6 iodide single crystal components, the method comprising:
growing a single crystal of lithium-6 iodide, doped with a predetermined doping material, the growing occurring in an inert dry atmosphere;
slicing and polishing the single crystal, the slicing and polishing occurring in the inert dry atmosphere;
placing at least one piece of sliced and polished single crystal in a hermetically sealed container, the placing occurring in the inert dry atmosphere;
wherein the at least one piece of sliced and polished single crystal of lithium-6 iodide is not exposed to an atmosphere with moisture.

21. The method of claim 20 wherein the lithium-6 iodide is doped with Cerium.

\* \* \* \* \*